United States Patent [19]

Nakashima et al.

[11] Patent Number: 4,950,625

[45] Date of Patent: Aug. 21, 1990

[54] DIAMOND LASER CRYSTAL AND METHOD MANUFACTURING THE SAME

[75] Inventors: Takeru Nakashima; Shuichi Satoh; Kazuwo Tsuji, all of Hyogo, Japan

[73] Assignee: Sumitomo Electric Industries, Ltd., Osaka, Japan

[21] Appl. No.: 364,693

[22] Filed: Jun. 8, 1989

[30] Foreign Application Priority Data

Jun. 13, 1988 [JP] Japan .................. 63-145286
May 30, 1989 [JP] Japan .................. 1-137745

[51] Int. Cl.$^5$ ............................................. C04B 35/52
[52] U.S. Cl. ..................................... 501/86; 372/103; 372/42; 372/11; 156/DIG. 80; 423/446
[58] Field of Search ................... 501/86; 372/103, 42, 372/11; 156/DIG. 80; 423/446

[56] References Cited

U.S. PATENT DOCUMENTS 4,174,380 11/1979 Strong et al. ................... 423/446
4,399,364 8/1983 Evans et al. ................... 423/446

FOREIGN PATENT DOCUMENTS

86/03347 6/1986 PCT Int'l Appl. .................. 372/42

OTHER PUBLICATIONS

H. P. Bovenkerk, Some Observations on the Morphology and Physical Characteristics of Synthetic Diamond, The American Mineralogist, vol. 46, (1961).
A. T. Collins, Thomaz, and Jorge, Luminescence Decay Time of the 1.945 eV Center in Type Ib Diamond, J. Phys. C.: Solid State Phys., 16, (1983).
Article entitled: "Visible Color-Center Laser in Diamond" by S. C. Rand and L. G. DeShazer; Reprinted from Optics Letters, vol. 10, No. 10, Oct. 1985, pp. 481, 482, 483.
Article entitled: "High Temperature Annealing of Colour Centres in Type I Diamond", by A. T. Collins, Diamond Research '79, Wheatstone Physics Laboratory, Kings's College, London, pp. 7-12.
Article entitled: "Transformation of the State of Nitrogen in Diamond" by R. M. Chrenko et al., Nature, vol. 270, Nov. 10, 1977, pp. 141-144.
Journal of Physics C Solid St. Phys., 13, (1980), pp. 2641-2650, A. T. Collins.
"Proceeding of the Royal Society of London", A381, 1982, pp. 159-178, by T. Evans et al.
Journal of Physics D. Applied Physics, 15, (1982), pp. 1431-1438, by A. T. Collins.
Article in "Tunable Solid State Laser" by S. C. Rand, pp. 276-280, published by Springer Verlag.

*Primary Examiner*—William R. Dixon, Jr.
*Assistant Examiner*—C. Melissa Bonner
*Attorney, Agent, or Firm*—W. G. Fasse; D. H. Kane, Jr.

[57] ABSTRACT

A method of manufacturing a diamond laser crystal having an excellent laser efficiency is performed by first, preparing a synthetic type Ib diamond containing at least 60 volume percent of a (111) plane growth sector (43) is prepared. This synthetic diamond is then thermally treated under high temperature/high pressure, so that type Ib nitrogen contained in the synthetic diamond is converted to type IaA nitrogen. Thereafter an electron beam is applied to the synthetic diamond in order to generate vacancies in the synthetic diamond. Finally annealing is performed on the synthetic diamond to form H3 centers by coupling the type IaA nitrogen atoms contained in the synthetic diamond, with the vacancies. According to this method, the H3 centers can be formed in the synthetic type Ib diamond at high concentration, while formation of NV centers which become an obstacle to laser action, can be suppressed.

25 Claims, 12 Drawing Sheets

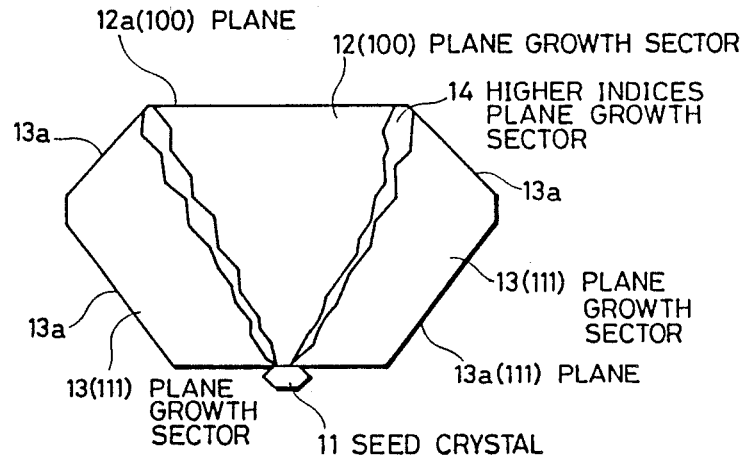
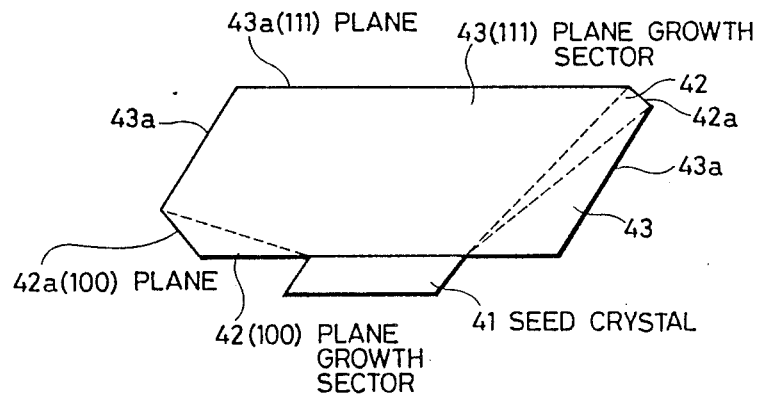
FIG.4

DIAMOND LASER CRYSTAL AND METHOD MANUFACTURING THE SAME

FIELD OF THE INVENTION

The present invention relates to a diamond laser crystal which can efficiently achieve laser action and a method of preparing the same, and more particularly, it relates to a method of preparing a diamond laser crystal which is formed have H3 centers in a type Ib diamond.

BACKGROUND INFORMATION

It is reported by S. C. Rand that H3 centers in a diamond can cause laser action (Optics Letters, 1985, Vol. 10 p. 481–483). In general, such H3 centers have been realized in natural type Ia diamonds, the optical and thermal characteristics of which have been examined in detail by A. T. Collins in Diamond Research, p. 7 (1979), (Journal of Physics D. Applied Physics, 15, p. 1431 (1982). It is known that most natural diamonds contain type IaA nitrogen and type IaB nitrogen as nitrogen impurities.

The H3 centers are formed by the type IaA nitrogen impurities and H4 centers are formed by the type IaB nitrogen impurities. The percentages of the type IaA nitrogen and the type IaB nitrogen vary in different diamonds, and those of the H3 centers and of the H4 centers also vary respectively. Thus, it has been difficult to selectively form only H3 centers in natural diamonds.

On the other hand, S. C. Rand has proposed the possibility of forming H3 centers in a synthetic type Ib diamond in "Tunable Solid State Laser" (Springer Verlag), p. 276. However, there has not been any method heretofore for independently forming only H3 centers in a synthetic type Ib diamond.

SUMMARY OF THE INVENTION

An object of the present invention is to provide a method of preparing a diamond laser crystal, which can form a large quantity of H3 centers with a high reproducibility in a synthetic type Ib diamond.

Another object of the present invention is to provide a diamond laser crystal which has an excellent laser efficiency.

The method of preparing a diamond laser crystal according to the present invention comprises the following steps:

(i) preparing a synthetic type Ib diamond containing at least 60 volume percent of a (111) plane growth sector;
(ii) converting type Ib nitrogen contained in the synthetic diamond to type IaA nitrogen by thermally treating the synthetic diamond under high temperature/high pressure;
(iii) generating vacancies in the synthetic diamond by irradiating the synthetic diamond with an electron or neutron beam; and
(iv) annealing the synthetic diamond to couple the type IaA nitrogens and the vacancies within the synthetic diamond, thereby to form H3 centers.

The synthetic type Ib diamond to be prepared may be doped with boron or nickel. In this case, the absorption coefficient of an infrared absorption peak of the synthetic type Ib diamond at a wavenumber of 1132 cm$^{-1}$ is preferably within a range of 0.8 to 15 cm$^{-1}$. The synthetic type Ib diamond to be prepared preferably contains type Ib nitrogen in a concentration within the range of 30 to 600 p.p.m.

Preferably the step of converting the type Ib nitrogen to the type IaA nitrogen includes a process of holding the synthetic diamond under a pressure of 3 to 7 GPa and a temperature within the range of 1500° to 2500° C. for at least five hours.

The electron beam to be applied to the synthetic diamond preferably has an energy of 0.5 to 4 MeV and a dose of $10^{17}$ to $10^{19}$ e/cm$^2$. The neutron beam to be applied to the synthetic diamond preferably has energy of 0.5 to 4 MeV and a dose of $10^{15}$ to $10^{17}$ n/cm$^2$.

The annealing treatment is preferably performed under a pressure of not more than $10^{-1}$ Torr. and a temperature within the range of 1300° to 1600° C. for at least five hours.

In another aspect of the present invention, a method of preparing a diamond laser crystal for the present purposes comprises the step of:

(i) preparing a synthetic type Ib diamond containing at least 60 volume percent of a (111) plane growth sector;
(ii) holding the synthetic diamond under a pressure of 3 to 7 GPa and a temperature within the range of 1800° to 2500° C. for at least five hours;
(iii) irradiating the synthetic diamond with an electron beam having an energy of 0.5 to 4 MeV in concentration of $10^{17}$ to $10^{19}$ e/cm$^2$; and
(iv) annealing the synthetic diamond under a pressure of not more than $10^{-1}$ Torr. and a temperature within the range of 1300° to 1600° C. for at least five hours.

The aforementioned method of preparing a diamond laser crystal may further comprise a preliminary step of holding the synthetic diamond under a pressure of not more than $10^{-1}$ Torr. and a temperature within the range of 600° to 1200° C. for at least five hours prior to the aforementioned annealing step.

In a still another aspect of the present invention, a method of preparing a diamond laser crystal comprises the following steps:

(i) preparing a synthetic type Ib diamond containing at least 60 volume percent of a (111) plane growth sector and being doped with boron or nickel;
(ii) irradiating the synthetic diamond with an electron or neutron beam;
(iii) holding the synthetic diamond under a pressure of 3 to 7 GPa a temperature within the range of and 1500° to 2500° C. for at least five hours after the first step of irradiating with the electron or neutron beam has been completed;
(iv) again irradiating the synthetic diamond with an electron or neutron beam after said step iii;
(v) holding the synthetic diamond in a vacuum at a temperature within the range of 1300° to 1600° C. for at least five hours.

In the aforementioned method of preparing a diamond laser crystal, the absorption coefficient of the synthetic type Ib diamond to be prepared with an infrared absorption peak is preferably within a range of 0.8 to 15 cm$^{-1}$ at a wavenumber of 1332 cm$^{-1}$. The synthetic type Ib diamond preferably contains type Ib nitrogen in, concentration within the range of 30 to 600 p.p.m.

The diamond laser crystal according to the present invention is produce from a synthetic type Ib diamond, and contains at least 60 volume percent of a (111) plane growth sector. The synthetic type Ib diamond is preferably doped with boron or nickel. In this case, the absorption coefficient of an infrared absorption peak of the synthetic type Ib diamond at a wavenumber of 1332 cm$^{-1}$ is preferably within a range of 0.8 to 15 cm$^{-1}$.

SIGNIFICANCE OF EMPLOYMENT OF (111) PLANE GROWTH

Sector in Synthetic Type Ib Diamond

A diamond comprises a (111) plane growth sector which is a region grown in parallel with the (111) crystal plane, a (100) plane growth sector which is a region grown in parallel with the (100) crystal plane and a higher indices plane growth sector. FIG. 1 shows respective sectors in an industrially mass-produced diamond. Referring to FIG. 1, numeral 11 denotes a seed crystal, numeral 12 denotes a (100) plane growth sector, numeral 12a denotes the (100) crystal plane, numeral 13 denotes a (111) plane growth sector, numeral 13a denotes the (111) crystal plane and numeral 14 denotes a higher indices plane growth sector.

Even if there is little difference between type Ib nitrogen concentration in the (111) plane growth sector and that in the (100) plane growth sector, an extreme difference is observed between types and quantities of color centers formed in the sectors through respective treatment steps. In this regard, the inventors have discovered that the (111) plane growth sector is advantageous for forming H3 Centers. The difference in the absorption of impurity nitrogen and the formation of color centers between the sectors, which this, difference can be increased through the respective treatment steps as disclosed herein.

Treatment steps necessary for forming H3 centers in type Ib diamonds are those of aggregation, irradiation by means of an electron or neutron beam and vacuum annealing. The aggregation step is required for converting dispersive nitrogen atoms (type Ib nitrogen) to pairs of nitrogen atoms (type IaA nitrogen). Vacancies are produced in the diamond by irradiating the synthetic diamond with the electron or neutron beam. The type IaA nitrogens are coupled with the vacancies by the final annealing step, to form H3 centers.

The difference in optical properties caused between the sectors by the aggregation step will now be described. FIG. 2 shows visible-ultraviolet absorption spectra observed before and after aggregation. Referring to FIG. 2, numeral 21 denotes the spectrum of the (111) plane growth sector observed before aggregation. Numeral 22 denotes the spectrum of the (100) plane growth sector observed before aggregation. Numeral 23 denotes the spectrum of the (111) plane growth sector observed after aggregation. Numeral 24 denotes the spectrum of the (100) plane growth sector observed after aggregation. The diamond herein employed has a type Ib nitrogen concentration of 140 p.p.m. in both the (111) plane growth sector and the (100) plane growth sector, and there is no difference between the visible-ultraviolet absorption spectra observed before aggregation. However, when aggregation is performed by holding this diamond under a pressure of 5 GPa in pressure and 2300° C. a temperature of for 20 hours, a significant difference is caused between the absorption spectra of the (111) plane growth sector and the (100) plane growth sector, as clearly understood from the spectra 23 and 24 shown in FIG. 2. Such absorption is caused by nitrogen impurities. Further, this absorption first appears at a wavelength of about 590 nm in the (111) plane growth sector, and is abruptly increased as the wavelength is reduced. In the (100) plane growth sector, on the other hand, absorption first appears at a wavelength of about 610 nm and is gradually increased as the wavelength is reduced. The absorption region of H3 centers is in the range of 450 to 505 nm, and hence it is understood that the (111) plane growth sector is more preferable since absorption of the nitrogen impurities is small in this wavelength range.

FIG. 3 shows absorption spectra of a synthetic diamond which is irradiated with an electron beam having an energy of 2 MeV with a dose of $10^{18}$ e/cm$^2$ and then annealed in a vacuum at 850° C. for five hours. Referring to FIG. 3, numeral 31 denotes the spectrum of the (111) plane growth sector after annealing, and numeral 32 denotes the spectrum of the (100) plane growth sector after annealing. It is understood from FIG. 3 that new absorption phenomena appear by annealing. One such phenomenon is the absorption by H3 centers which are formed by coupling type IaA nitrogens with vacancies in the lattice. Another phenomenon is the absorption by NV centers (wavelength range: 450 to 640 nm) formed by coupling of type Ib nitrogens, which are left in the diamond by incomplete aggregation, and with the vacancies. The difference between the (100) plane growth sector and the (111) plane growth sector clearly appears also in this case.

In the (111) plane growth sector, absorption by the H3 centers is observed simultaneously with that by the NV centers. On the other hand, it is shown that only extreme absorption by the NV centers is observed and H3 centers are hardly formed in the (100) plane growth sector. It is also shown from this annealing treatment that employment of the (111) plane growth sector is an important factor for formation of the H3 centers.

As hereinabove described, it is possible to prepare a diamond having H3 centers by using a diamond containing only a (111) plane growth sector, through the difference appearing between the sectors in the steps of aggregation and annealing.

In a general synthesizing method utilizing the (100) plane of a seed crystal, the (111) plane growth sector region is narrow and optical measurements cannot be easily performed. In order to obtain a wide region for the (111) plane growth sector, therefore, the (111) plane is employed as the crystal plane of a seed crystal 41 as shown in FIG. 4, to synthesize a diamond by a temperature gradient method, for example. Thus, a diamond having a wide region for the (111) plane growth sector can be obtained. Referring to FIG. 4, numeral 41 denotes the seed crystal, numeral 42 denotes the (100) plane growth sector, numeral 42a denotes the (100) plane, numeral 43 denotes the (111) plane growth sector and numeral 43a denotes the (111) plane.

TREATMENT CONDITION FOR CONVERTING TYPE Ib NITROGEN TO TYPE IaA NITROGEN

As hereinabove described, it is known to diffuse nitrogen atoms under high temperature/high pressure to form nitrogen atom pairs, in order to convert type Ib nitrogen to type IaA nitrogen. It is also known that aggregation is accelerated by irradiation with as electron or neutron beam prior to the high temperature/high pressure treatment (R. M. Chrenko et al.: Nature 270, Nov. 1977 p. 141 and A. T. Collins: Journal of Physics C Solid State Physics, 13, 1980, p. 2641). It is further known that the conversion type Ib nitrogen to type IaA nitrogen can be expressed as follows:

$$kt = 1/C - 1/C_0$$

where t represents the treatment time, $C_0$ represents initial concentration of the type Ib nitrogen, C represents the type Ib nitrogen concentration after the treatment and k represents the reaction rate constant. The reaction rate constant k indicates the temperature dependency, which is expressed as follows:

$$k \alpha \exp(-E/(k_B \cdot T))$$

where $k_B$ represents the Boltzmann constant, T represents the temperature and E represents the activation energy.

In order to prepare a laser crystal, it is necessary to convert type Ib nitrogen to type IaA nitrogen as completely as possible. If this conversion is incomplete, residual type Ib nitrogen is coupled with the vacancies after the irradiating step by the electron beam or the neutron beam and the annealing step to form NV centers. The NV centers have an absorption band in the emission band of the H3 centers, and block laser action of the H3 centers. Therefore, conditions for increasing the reaction rate constant k have been studied.

It is shown from the aforementioned two expressions that the conversion reaction of type Ib nitrogen to type IaA nitrogen, is accelerated as the treatment temperature is increased. However, if the temperature is abnormally increased a, reverse reaction is started to convert the type IaA nitrogen to the type Ib nitrogen (T. Evans et al.: Proceeding of the Royal Society of London A 381, 1982, p. 159). Thus, there is an optimum temperature for forming nitrogen atom pairs. FIG. 5 shows temperature dependence of experimentally obtained reaction rate constants k. The values shown in FIG. 5 result from examination of temperature dependency of a sample irradiated with an electron beam prior to aggregation and that aggregated with no electron irradiation. The treatment pressure was 5 GPa, and the residual type Ib nitrogen concentration after treatment was estimated from based on changes in the signal strength of the electron spin resonance (ESR).

FIG. 5 shows the following facts representing the results of the experiment shown in FIG. 5:

(1) Conversion from the type Ib nitrogen to the type IaA nitrogen occurs within a temperature range of 1800° C. to 2500° C., and most efficiently at about 2300° C. At least 97% of the nitrogen atoms are paired when the synthetic diamond is held under this temperature for at least 20 hours.

(2) Within the temperature range of 1800° C. to 2500° C., no significant difference appears between the reaction rate constants of the sample irradiated with the electron beam before aggregation and that aggregated with no electron irradiation. Thus, it is understood that the type IaA nitrogen, which is necessary for forming the H3 centers, can be efficiently formed by performing aggregation within the temperature range of 1800° C. to 2500° C.

When a synthetic type Ib diamond doped with boron or nitrogen is employed, the reaction rate constant is substantially increased by irradiation by means of an electron or neutron beam before aggregation. FIG. 6 shows the temperature dependence of the experimentally obtained reaction rate constants k, similarly to FIG. 5. Referring to FIG. 6, the solid line 51 shows the temperature dependence of a nondoped synthetic diamond which was aggregated without any electron irradiation. The broken line 52 shows temperature dependence of a nondoped synthetic diamond which was aggregated with electron irradiation. The dash-dotted line 53 shows the temperature dependence of a synthetic diamond doped with boron, which was aggregated with electron irradiation. The energy of the electron beam employed in this experiment was 2 MeV, while a dose thereof was $1 \times 10^{18}$ e/cm$^2$. The reaction time was 40 hours.

FIG. 6 shows the following facts:

(1) The maximal value of the reaction rate constant k is at about 2300° C.

(2) Within a temperature range of not more than 2000° C., the reaction rate constant is substantially increased by electron irradiation before aggregation. Particularly in the synthetic diamond doped with boron, the reaction rate constant is substantially increased by performing electron irradiation prior to aggregation, and the type Ib nitrogen can be sufficiently converted to the type IaA nitrogen at a temperature of 1500° C. The same effect was attained when the synthetic diamond was doped with nickel in place of boron. The same effect was also attained when the synthetic diamond was irradiated with a neutron beam in place of the electron beam. The dose of the electron beam to be applied is preferably within a range of $10^{17}$ to $10^{19}$ e/cm$^2$. In the case of the neutron beam, the dose may be within a range of $10^{15}$ to $10^{17}$ n/cm$^2$ since the same has a high ability of generating vacancies.

TREATMENT CONDITIONS FOR COUPLING TYPE IaA NITROGEN AND VACANCIES IN SYNTHETIC DIAMOND

The electron or neutron beam is applied to synthetic diamond for the purpose of introducing the vacancies into the diamond. However, since the type Ib nitrogen cannot be completely converted to the type IaA nitrogen, NV centers are inevitably formed by the irradiation of the electron or neutron beam and the subsequent annealing treatment. This is because aggregation is incompletely performed, residual of type Ib nitrogen. Thus, the type Ib nitrogen atoms are coupled with the vacancies to form the NV centers. Further, at a general annealing temperature of 850° C. for a natural diamond, the vacancies are easily coupled with the type Ib nitrogen atoms, rather than with the type IaA nitrogen. Therefore, the ratio of the number of the NV centers to the number of of the H3 centers is increased as compared with the concentration ratio of the type Ib nitrogen to the type IaA nitrogen although the type Ib nitrogen has a small concentration, and hence the NV centers are excessively formed. Thus, the NV centers are inevitably formed when aggregation cannot be completely performed.

According to the invention the formation of the NV centers has been successfully suppressed by further increasing the annealing temperature. FIG. 7 shows changes of the absorption coefficients of H3 centers and NV centers in the case of performing annealing for five hours at temperatures of 850°, 1200° C., 1400° C. and 1600° C. respectively. Referring to FIG. 7, the solid line 61 shows the change in the absorption coefficient of the H3 centers, and the dashed line 62 shows the change in the absorption coefficient of the NV centers. As shown in FIG. 7, the absorption coefficient of the NV centers peaks at a temperature of about 1200° C., and is abruptly reduced in a temperature range exceeding 1200° C. while absorption substantially disappears at a temperature of about 1400° C. On the other hand, the absorption coefficient of the H3 centers is substantially unchanged up to a temperature of about 1400° C., and reduction thereof is started at a temperature of about 1460° C. This means that, when the annealing temperature is at 1200° C., the NV centers are so destabilized that those once formed are decomposed. When the annealing temperature is set within a range of 1300° C. to 1600° C., therefore, formation of the NV centers can be suppressed so that only the H3 centers are formed. A preferable annealing temperature is about 1400° C. FIG. 8 shows an exemplary spectrum which is obtained when annealing is performed at 1400° C.

A synthetic type Ib diamond containing the type Ib nitrogen of about 120 p.p.m. and being doped with nickel was annealed under the same conditions as above to examine changes in absorption coefficients of H3 centers and NV centers. The results were identical to those shown in FIG. 7.

SIGNIFICANCE OF DOPING OF SYNTHETIC TYPE Ib DIAMOND WITH BORON OR NICKEL

According to the invention it has been found that the H3 centers can be more efficently formed by performing aggregation, irradiation an electron or neutron beam and annealing of the synthetic type Ib diamond which is doped with boron or nickel.

In the synthetic type Ib diamond doped with boron or nickel, the absorption coefficient peaks at a wavenumber of 1332 cm$^{-1}$ of infrared absorption. FIG. 9 shows an infrared absorption spectrum 71 of the type Ib diamond doped with boron as compared with an infrared absorption spectrum 72 of the nondoped type Ib diamond. As clearly shown in FIG. 9, the absorption coefficient of the type Ib diamond doped with boron peaks at the wavenumber of 1332 cm$^{-1}$ as mentioned above. A spectrum identical to the spectrum 71 is obtained also when the diamond is doped with nickel in place of boron. Absorption at 1332 cm$^{-1}$ is proportional to the amount of doping. However, it is extremely difficult to correctly measure the concentration of boron or nickel, and hence the amount of doping is hereinafter replaced by the infrared absorption coefficient. It has been recognized from measurements made heretofore that the absorption coefficient of 1 cm$^{-1}$ corresponds a boron or nickel concentration of about 1 to 10 p.p.m.

FIG. 10 shows visible-ultraviolet-absorption spectra obtained by aggregating samples of a synthetic type Ib diamond doped with boron and a nondoped synthetic type Ib diamond, irradiating the samples with an electron or neutron beam and annealing the same. Numeral 81 denotes the spectrum of the sample doped with boron, and numeral 82 denotes that of the nondoped sample. As shown in FIG. 10, H3 centers, NV centers and H2 centers are observed.

FIG. 11 illustrates changes in the absorption coefficients of the respective centers caused by doping samples with boron or nickel. The dashed line 91 shows the absorption coefficient of the H3 centers, the dash-dotted line 92 shows that of the NV centers and the solid line 93 shows that of the H2 centers. The samples employed for obtaining the data shown in FIG. 11 had substantially an identical type Ib nitrogen concentration of about 160 p.p.m.

From the results in FIGS. 10 and 11, it is shown that the following effects are attained by doping the diamond with boron or nickel:

(i) Acceleration of the Formation of H3 Centers

The following relationship holds true between the absorption coefficient $\alpha$(H3) of the H3 centers and the absorption coefficient $\alpha$(H2) of the H2 centers:

$$\alpha(H3) + 3.2\alpha(H2) = \text{constant}.$$

In other words, the percentage of the H3 centers is increased by doping the diamond with boron or nickel. It is believed that boron or nickel acts as an acceptor, to which a charge transfer by nitrogen occurs in diamond.

(ii) Suppression of the Formation of NV Centers

As clearly shown in FIGS. 10 and 11, the formation of the NV centers is suppressed by doping the diamond with boron or nickel. It may be considered that such a phenomenon is caused the conversion to the type IaA nitrogen is accelerated and the residual type Ib nitrogen concentration is reduced by doping the diamond with boron or nickel. Further, such an effect is also attained since a secondary absorption edge (220 to 500 nm) of the type Ib nitrogen is reduced by reduction of the residual type Ib nitrogen.

The above effect is important for laser action of the H3 centers. As shown in FIG. 9, the amount of doping of boron or nickel can be defined by the infrared absorption peak at 1332 cm$^{-1}$. According to the invention it has been found that laser action of the H3 centers is possible if the absorption coefficient at this peak is at least 0.8 cm$^{-1}$. On the other hand, the upper limit of the absorption coefficient at 1332 cm$^{-1}$ is mainly limited by the limit amount of doping of boron or nickel. This upper limit is 15 cm$^{-1}$. Comparing boron with nickel as doping materials, boron is superior to nickel in consideration of the amount capable of doping, control of the amount of doping etc. The method of changing the amount of formation of the color centers by doping a synthetic type Ib diamond with boron or nickel is an absolutely novel technique.

SIGNIFICANCE OF THE CONTENT OF AT LEAST 60 VOLUME PERCENT OF (111) PLANE GROWTH SECTOR

When the H3 centers are employed as a laser active material, a diamond laser crystal preferably contains the minimum percentage of the (100) plane growth sector. This is so because the NV centers contained in the (100) plane growth sector inevitably resorb emission from the H3 centers as hereinabove described, to extremely decrease the gain of the H3 center laser.

As described above, the formation of the H3 centers is accelerated by doping the synthetic type Ib diamond with boron or nickel. However, the amount of boron or nickel thus used for doping is extremely varied with the types of the growth sectors of the crystal. Both of these elements are selectively doped in the (111) plane growth sector, while the same are only slightly doped in the (100) plane growth sector. Therefore, the H3 centers are hardly formed while the NV centers are easily formed in the (100) plane growth sector. The H3 centers are increased and the NV centers are reduced over the entire crystal by reducing the percentage of the (100) plane growth sector and increasing that of the (111) plane growth sector in the crystal. Through experiments, it has been found that the percentage of the (111) plane growth sector must be at least 60 volume percent of the crystal, in order to achieve laser action of the H3 centers.

In order to synthesize such a crystal, the diamond may be synthesized in accordance with the temperature gradient method, for example, by employing the (111) plane as the crystal plane of the seed crystal, as hereinabove described with reference to FIG. 4.

RANGE OF NITROGEN CONCENTRATION IN SYNTHETIC TYPE Ib DIAMOND

In order to efficiently form H3 centers, the synthetic type Ib diamond preferably contains type Ib nitrogen in concentration of 30 to 600 p.p.m. As hereinabove described, the sum of the absorption coefficients of the H3 centers and the H2 centers is determined by the initial type Ib nitrogen concentration with no regard to the amount of doping of boron or nickel. The relationship between the sum of the absorption coefficients of the H3 centers and the H2 centers and the initial type Ib nitrogen concentration have been examined. FIG. 12 shows the result. The following relational expression is obtained from the result shown in FIG. 12:

$$\alpha(H3) + 3.2\alpha(H2) = 13.2 \log N - 18.9$$

where $\alpha(H3)$ represents the absorption coefficient of the H3 centers, $\alpha(h2)$ represents that of the H2 centers, and N represents the initial type Ib nitrogen concentration. It is understood from the above expression that the type Ib nitrogen concentration must be at least 30 p.p.m. in order to form the H3 centers in the diamond. On the other hand, the upper limit of the type Ib nitrogen concentration is defined by the amount of nitrogen which can be doped into the diamond. That is, the upper limit of the type Ib nitrogen concentration is 600 p.p.m. The type Ib nitrogen concentration in the diamond was calculated by the infrared absorption peak at 1130 $cm^{-1}$.

EFFECT OF THE INVENTION

According to the present invention, as hereinabove described, H3 centers can be formed in a synthetic type Ib diamond in at a high concentration, and formation of NV centers which become an obstacle to laser action can be suppressed. Thus, the diamond crystal obtained according to the present invention is employable as a laser crystal, the wavelength of which is variable within a range of 500 to 600 nm.

BRIEF DESCRIPTION OF THE DRAWINGS

FIG. 1 schematically illustrates states of sectors of a synthetic diamond grown from the (100) plane of a seed crystal, as viewed from the (110) plane direction;

FIG. 4 schematically illustrates states of sectors of a synthetic diamond grown from the (111) plane of a seed crystal;

DESCRIPTION OF EXAMPLES

Example 1

Figure 2:
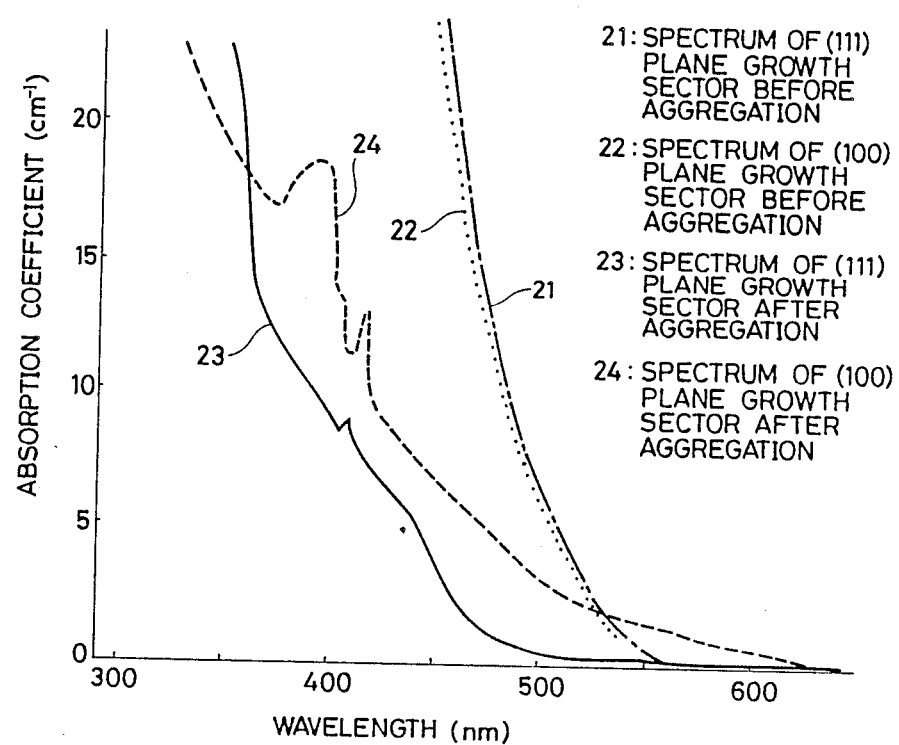
FIG. 2 shows visible-ultraviolet absorption spectra observed before and after aggregation.
Figure 3:
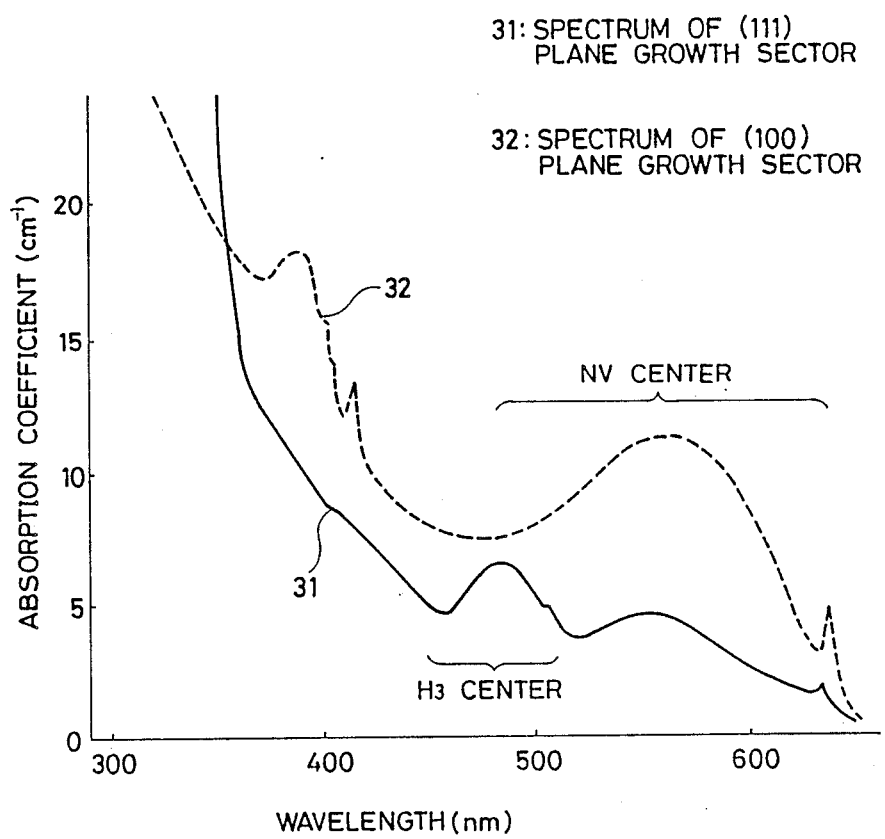
FIG. 3 shows visible-ultraviolet absorption spectra of a (111) plane growth sector and a (100) plane growth sector observed after annealing.
Figure 5:
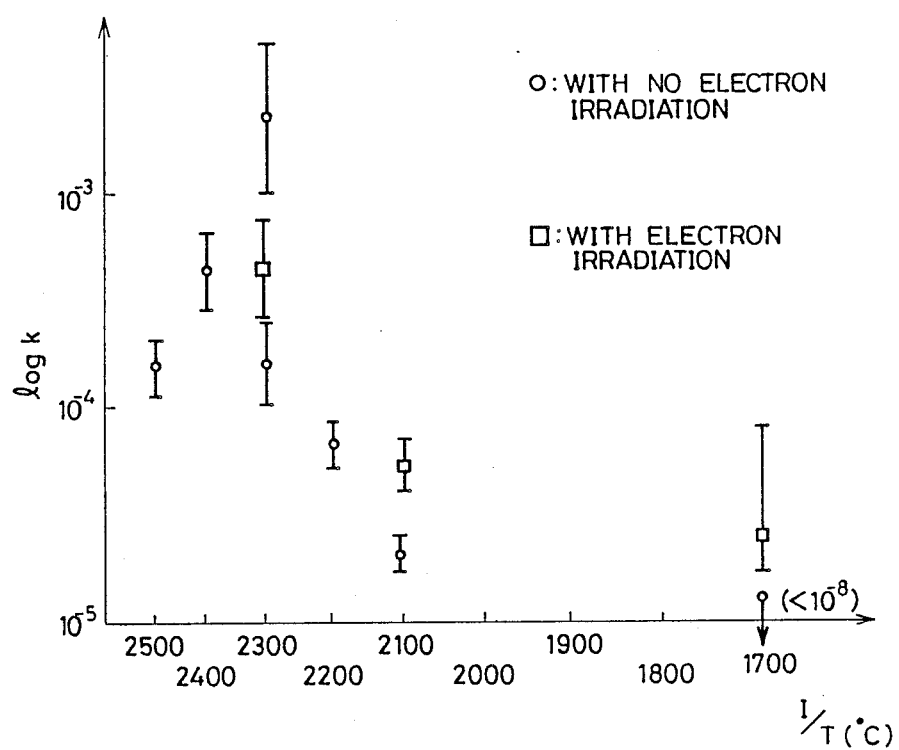
FIG. 5 shows the relationship between aggregation temperatures and reaction rate constants.
Figure 6:
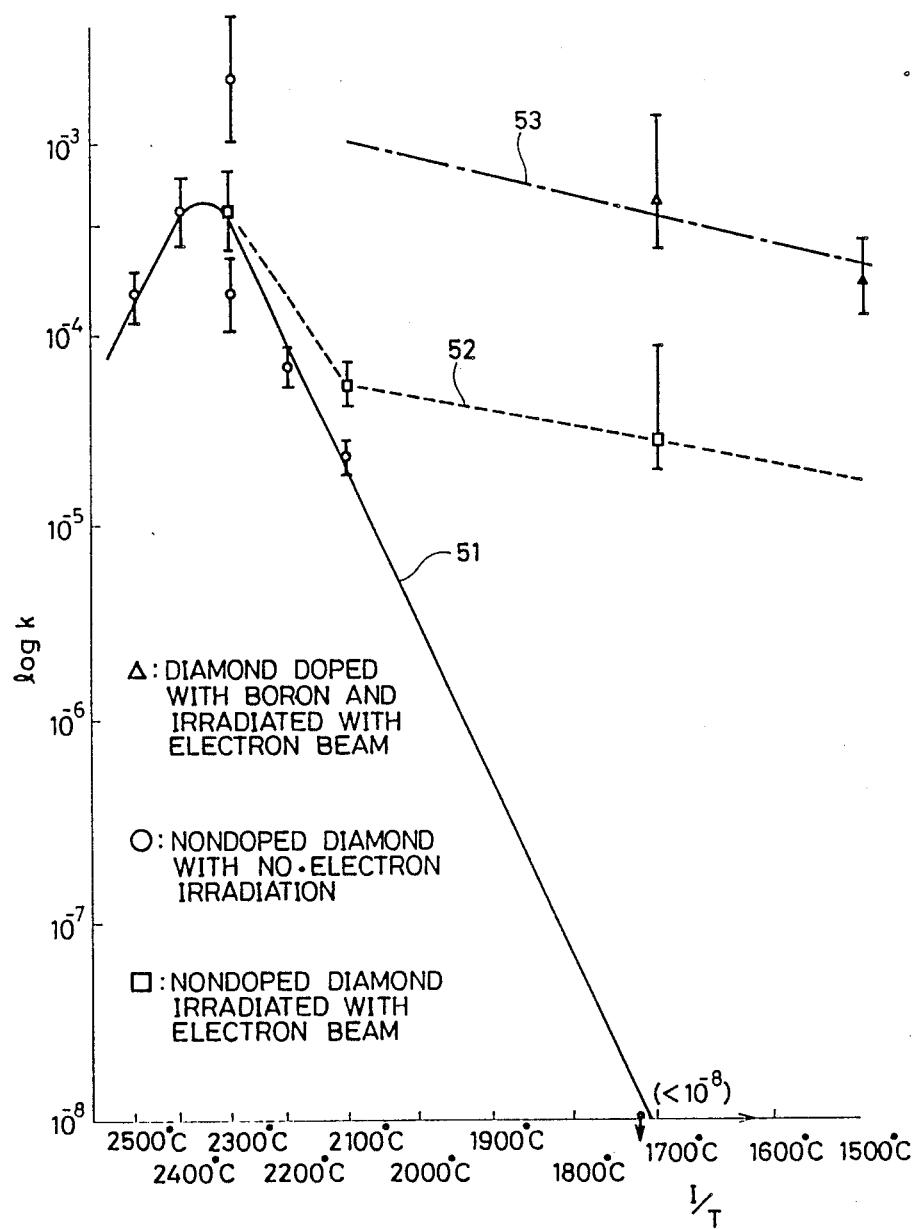
FIG. 6 shows the relationship between aggregation temperatures and reaction rate constants, similarly to FIG. 5.
Figure 7:
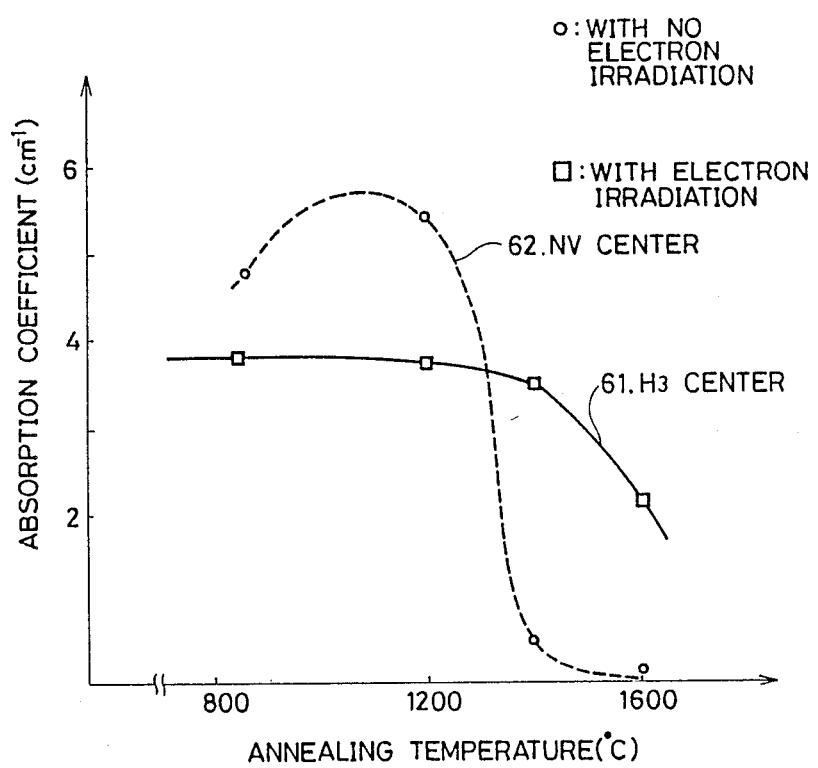
FIG. 7 shows changes of absorption coefficients of NV centers and H3 centers caused following changes in annealing temperatures.
Figure 8:
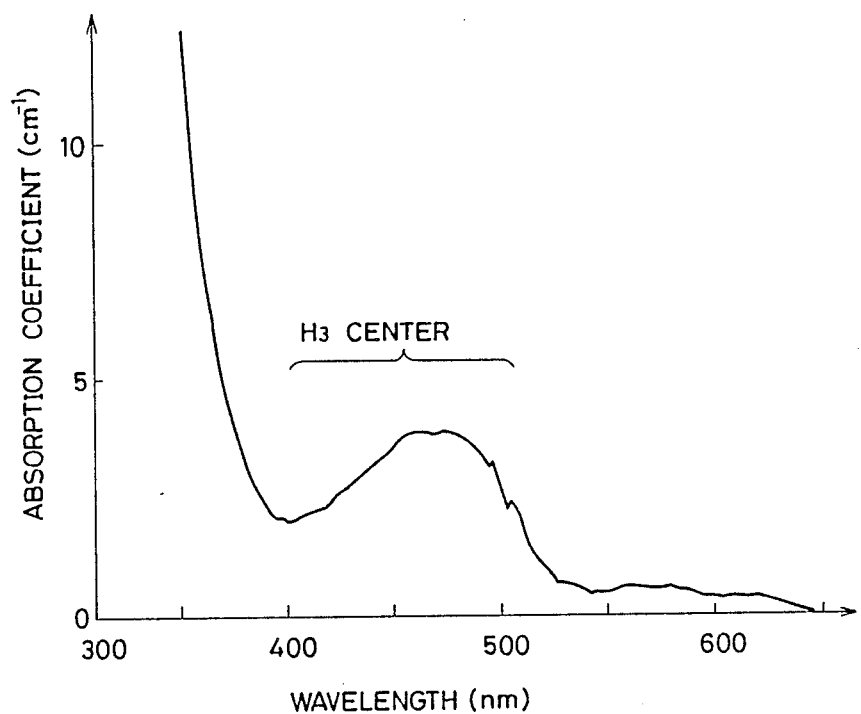
FIG. 8 shows an exemplary spectrum of a diamond obtained at an annealing temperature of 1400° C.
Figure 9:
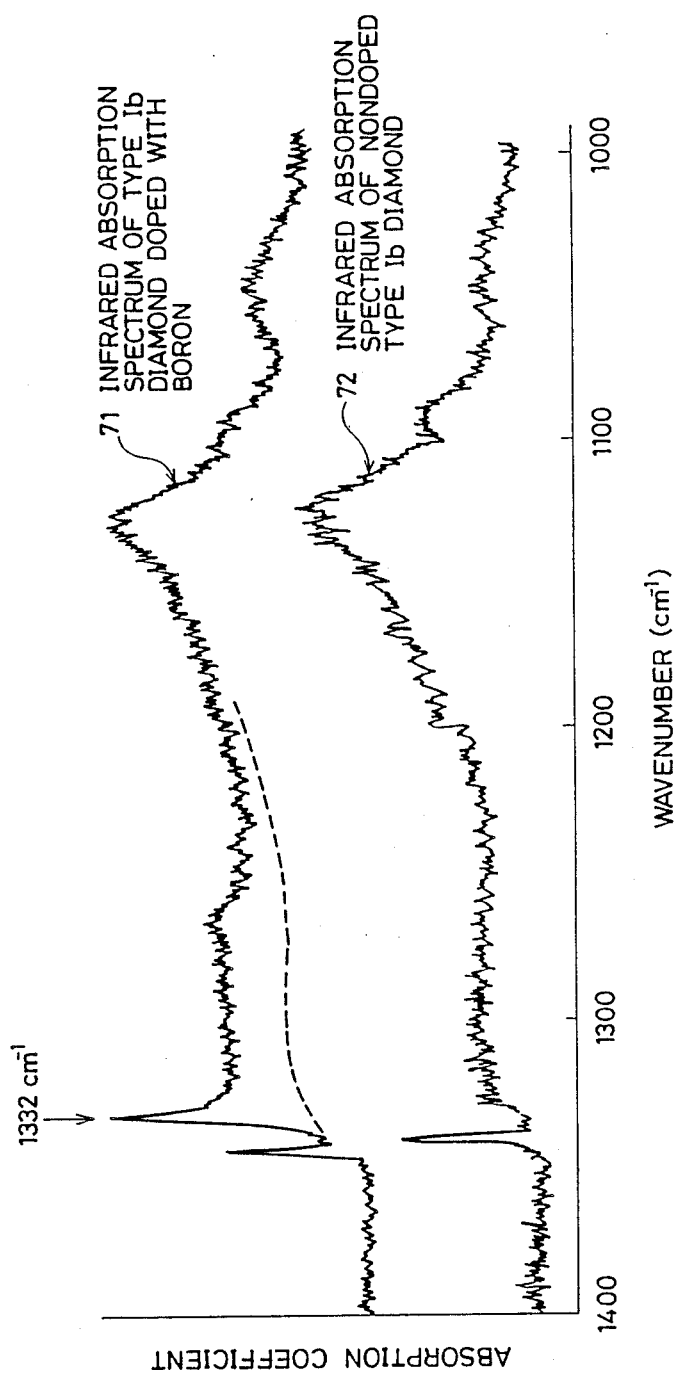
FIG. 9 shows the infrared absorption spectrum of a type Ib diamond which is doped with boron as compared with that of a nondoped type Ib diamond.
Figure 10:
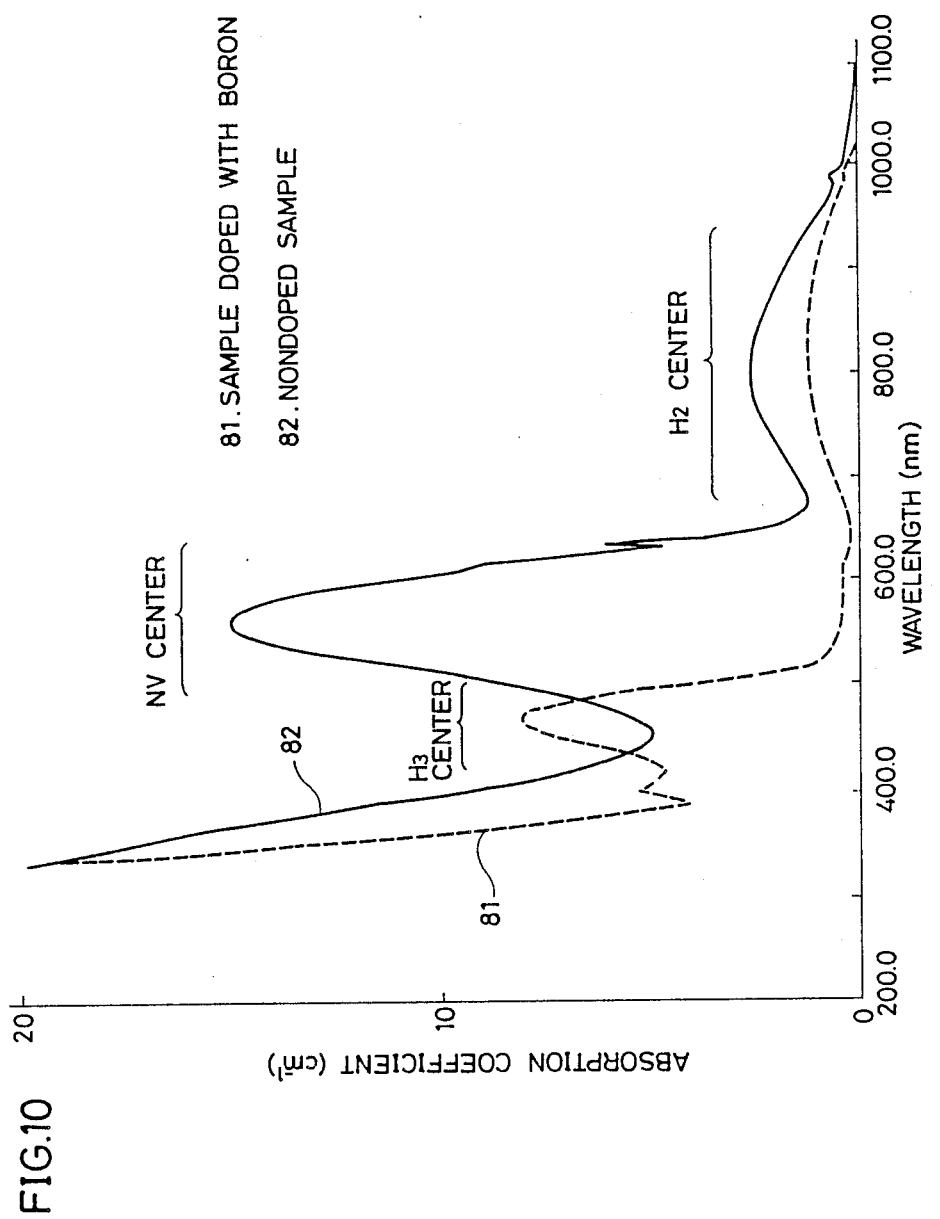
FIG. 10 shows the visible-ultraviolet absorption spectrum of a type Ib diamond which is doped with boron as compared with that of a nondoped type Ib diamond.
Figure 11:
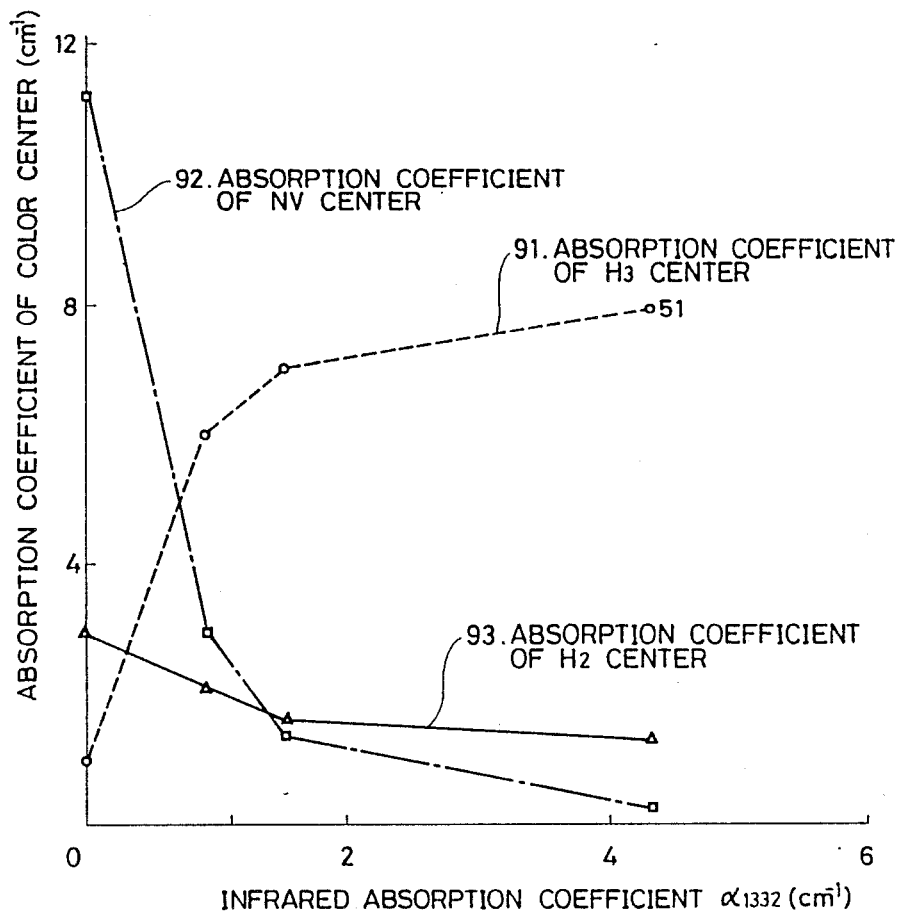
FIG. 11 shows the relationship between absorption coefficients of various types of color centers and infrared absorption peak intensity levels at 1332 $cm^{-1}$.
Figure 12:
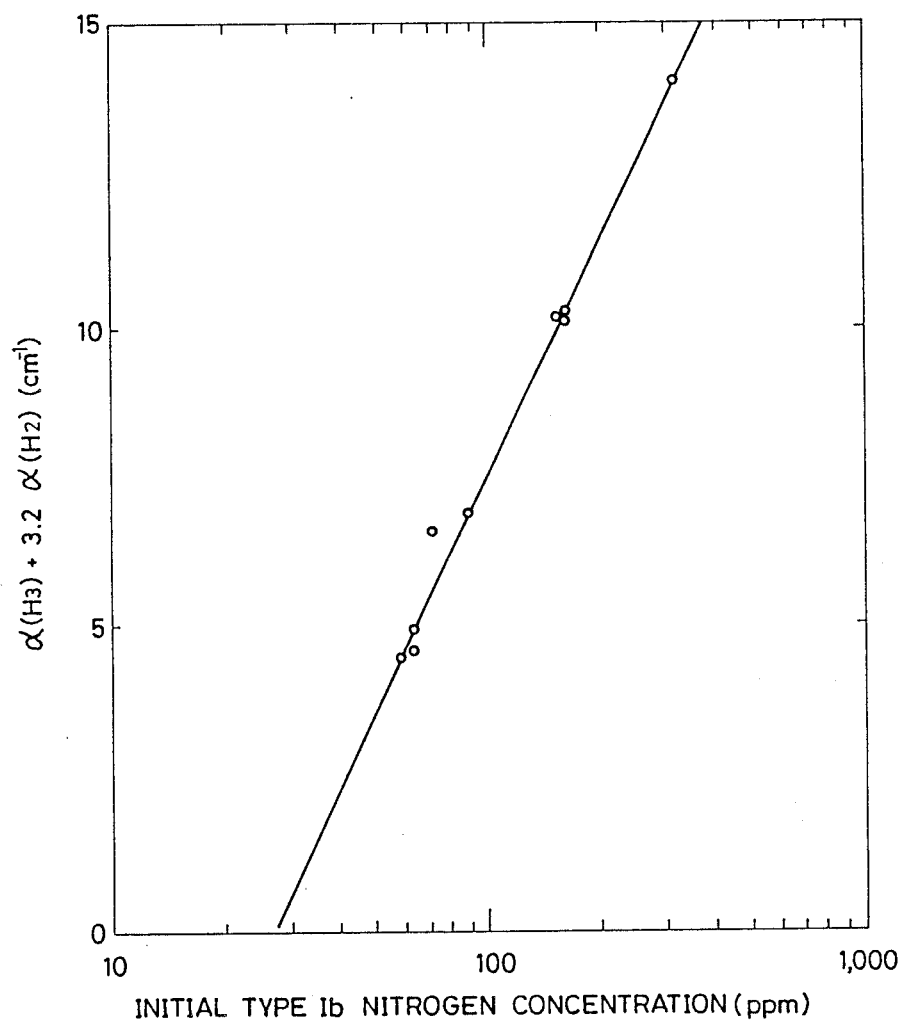
FIG. 12 shows the relationship between H3 and H2 centers and initial type Ib nitrogen concentration values.

H3 centers were formed by employing (111) plane growth sectors and (100) plane growth sectors in the same crystals of type Ib diamond samples synthesized by the temperature gradient method, to obtain the results shown in Table 1.

Nitrogen concentration values shown in Table 1 were calculated from infrared absorption coefficients at 1130 $cm^{-1}$. Absorption coefficients of nitrogen impurities are those mainly of type Ib nitrogen at a wavelength of 480 nm, at which absorption by the H3 centers is maximized. Table 1 shows both values observed before aggregation and values observed after aggregation. Absorption coefficients of H3 centers are those at a wavelength of 480 nm, at which absorption by the H3 centers in the phonon side band is maximized. These values are preferably low since the H3 centers appear overlappingly with absorption by the nitrogen impurities after aggregation. Absorption coefficients of NV centers are those at a wavelength of 580 nm, at which absorption by the NV centers in the phonon side band is maximized. These values are preferably suppressed at low levels since absorption by the NV centers partially overlaps with that by the H3 centers, while the absorption region of the NV centers is in the emission region (505 to 600 nm) of the H3 centers.

Treatment conditions for the samples employed in this Example are as follows:

Aggregation: the samples were held under pressure of 5 GPa and a temperature of 2300° C. for 20 hours Electron Irradiation: with energy of 2 MeV and a dose of $10^{18}$ e/$cm^2$ Annealing in Vacuum: the samples were held at 850° C. for five hours.

TABLE 1

| | Sample No. | |
|---|---|---|
| | 1 | 2 |
| Sector | (111) Plane Growth Sector | (100) Plane Growth Sector |
| Type Ib Nitrogen Concentration | 140 ppm | 140 ppm |
| Absorption Coefficient of Nitrogen Impurity at λ = 480 nm (before Aggregation) | 4.1 $cm^{-1}$ | 4.2 $cm^{-1}$ |
| Absorption Coefficient of Nitrogen | 1.3 $cm^{-1}$ | 3.1 $cm^{-1}$ |

TABLE 1-continued

| | Sample No. | |
|---|---|---|
| | 1 | 2 |
| Impurity at λ = 480 nm (after Aggregation) | | |
| Absorption Coefficient of H3 Center (λ = 480 nm) | 3.8 cm$^{-1}$ | 0 cm$^{-1}$ |
| Absorption Coefficient of NV Center (λ = 580 nm) | 4.7 cm$^{-1}$ | 11.3 cm$^{-1}$ |
| | Example | Comparative Sample |

EXAMPLE 2

Type Ib diamond sample synthesized according to the temperature gradient method were aggregated, to calculate reaction rate constants in conversion from type Ib nitrogen to type IaA nitrogen. Experiments were made on both types of samples irradiated with electron beams before aggregation and those aggregated with no electron beam irradiation at various temperatures. The conditions for electron irradiation were 2 MeV in energy and $10^{18}$ e/cm$^2$ in dosage.

Table 2 shows the results. It is recognized from the results shown in Table 2 that no significant difference appears between the samples irradiated with the electron beams before aggregation and those aggregated with no electron irradiation when the treatment temperature is about 2000° C.

changes in absorption coefficients of the H3 centers and the NV centers.

Table 3 shows the results indicating. It is recognized from the that the absorption coefficients of the NV centers are abruptly reduced as the annealing temperatures are increased.

TABLE 3

| | Sample No. | | | |
|---|---|---|---|---|
| | 21 | 22 | 23 | 24 |
| Annealing Temperature | 800° C. | 1200° C. | 1400° C. | 1600° C. |
| Annealing Time (h.) | 5 | 5 | 5 | 5 |
| Absorption Coefficient of NV Center (= 580 nm) | 4.7 cm$^{-1}$ | 5.1 cm$^{-1}$ | 1.0 cm$^{-1}$ | <0.2 cm$^{-1}$ |
| Absorption Coefficient of H3 Center (= 480 nm) | 3.8 cm$^{-1}$ | 3.7 cm$^{-1}$ | 3.5 cm$^{-1}$ | 2.1 cm$^{-1}$ |
| | Comparative Sample | Comparative Sample | Example | Example |

EXAMPLE 4

Type Ib diamond samples (2.5 mm in thickness) synthesized by the temperature gradient method, were aggregated under pressure of 5.0 GPa and a temperature of 2300° C. for 20 hours. The samples thus obtained were irradiated with electron beams having an energy of 2 MeV with a dose of $10^{18}$ e/cm$^2$. Finally the samples were annealed in vacuum at 1400° C. for five hours. As shown in Table 4, the samples were different in volume ratios of regions of (111) plane growth sectors and (100) plane growth sectors.

These samples were subjected to a laser oscillation test. Laser light having a wavelength of 490 nm and a 40 nsec pulse width, was employed as excitation light. No external resonator was employed but Fresnel reflection on diamond crystal end surfaces was utilized. The intensity of the excitation light was 120 MW/cm$^2$ at the maximum, and the sample that did not oscillate at this value, was considered not to acheive any laser action. Table 4 shows the results.

TABLE 2

| | Sample No. | | | | | | |
|---|---|---|---|---|---|---|---|
| | 11 | 12 | 13 | 14 | 15 | 16 | 17 |
| Type Ib Nitrogen Concentration (ppm) | 71 | 53 | 95 | 87 | 52 | 38 | 49 |
| Electron Irradiation | No | Yes | No | Yes | No | No | No |
| Treatment Temperature (°C.) | 1700° C. | 1700° C. | 2000° C. | 2000° C. | 2200° C. | 2300° C. | 2500° C. |
| Treatment Time (h) | 45h | 50h | 15h | 15h | 15h | 15h | 15h |
| Reaction Rate Constant (ppm$^{-1}$, min$^{-1}$) | <10$^{-8}$ | 2.5 × 10$^{-5}$ | 7.1 × 10$^{-5}$ | 6.8 × 10$^{-5}$ | 6.7 × 10$^{-5}$ | 2.4 × 10$^{-3}$ | 1.6 × 10$^{-4}$ |
| | Comparative Sample | Comparative Sample | Example | Comparative Sample | Example | Example | Example |

EXAMPLE 3

(111) plane growth sectors (type Ib nitrogen concentration: 140 p.p.m.) of type Ib diamond samples synthesized by the temperture gradient method were aggregated under pressure of 5.0 GPa and a temperature of 2300° C. for 20 hours. Thereafter electron irradiation was performed under conditions of 2 MeV and $10^{18}$ e/cm$^2$. The samples thus obtained were sequentially annealed in vacuum at various temperatures, to examine (111) plane growth sectors and (100) plane growth sectors were considered not so by an X-ray topography, for to calculating the percentages thereof.

TABLE 4

|  | Sample No. | | |
| --- | --- | --- | --- |
|  | 31 | 32 | 33 |
| Volume Ratio of (111) Plane Growth Sector | 50% | 60% | 100% |
| Nitrogen Concentration | 127 ppm | 132 ppm | 140 ppm |
| Absorption Coefficient of H3 Center | 0.9 cm$^{-1}$ | 2.3 cm$^{-1}$ | 3.5 cm$^{-1}$ |
| Absorption Coefficient of NV Center | 1.3 cm$^{-1}$ | 0.4 cm$^{-1}$ | <0.2 cm$^{-1}$ |
| Laser Oscillation | No | Yes | Yes |
|  | Comparative Sample | Example | Example |

EXAMPLE 5

Type Ib diamond samples used for doping with boron and nickel were prepared according to the temperature gradient method. Boron was doped by adding the same to carbon sources. Nickel was doped by adding a large amount of nickel to Fe solvents. Nitrogen concentration values were adjusted by adding FeN to the carbon sources. All of such crystals were grown on (111) planes. Synthesizing temperatures were changed in order to change the ratios of the (100) plane growth sectors to the (111) plane growth sectors in the crystals.

These crystals were worked into rectangular parallelopipeds of 2.0 mm in thickness.

Figure 13:
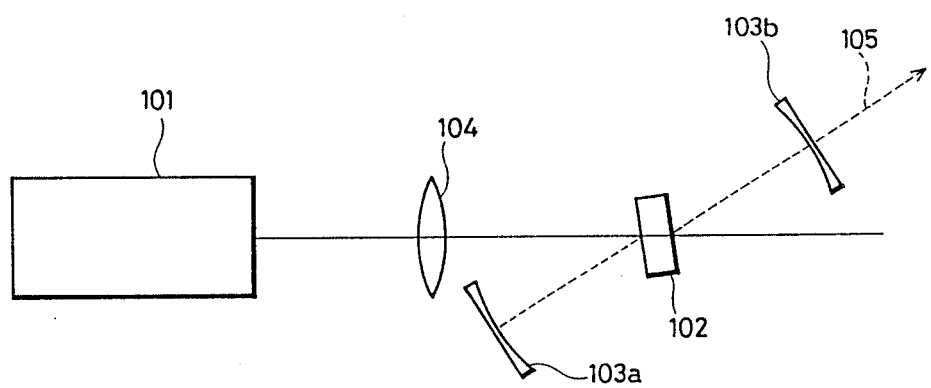
FIG. 13 schematically illustrates a laser oscillation experimentation apparatus.

The crystals prepared in the aforementioned manner were irradiated with electron beams under conditions of 2 MeV and $10^{18}$ e/cm$^2$, and thereafter the samples were held under pressure of 5 GPa and a temperature of and 1700° C. for five hours. Then the samples were again subjected to electron irradiation under conditions of 2 MeV and $3 \times 10^{18}$ e/cm$^2$. Thereafter the samples were annealed in vacuum at 1400° C. for five hours. Through the aforementioned steps, H3 centers were formed in the diamond samples. The diamond crystals were subjected to a laser oscillation test. FIG. 13 schematically illustrates a laser oscillator experimentation apparatus employed for this experiment. Referring to FIG. 13, numeral 101 denotes a flash lamp die laser, numeral 102 denotes a diamond laser crystal, numerals 103a and 103b denote a pair of resonators, numeral 104 denotes a lens and numeral 105 denotes outgoing laser light. Pulse excitation light outgoing from the flash lamp dye laser 102 is condensed by the lens 104, to be incident upon the diamond laser crystal 102. Consequently, the diamond laser crystal 102 generates fluorescence, which is amplified by the pair of resonators 103a and 103b. Finally the outgoing laser light 105 is outputted from the first resonator 103b.

In the apparatus employed for the test, the excitation light was emitted from a flash lamp die laser having a wavelength of 470 nm. Its energy was about 50 mJ. Reflection factors of the pair of resonators were 100% and 97% respectively.

First, the relation between the amounts of doping of nickel and boron and laser output intensity levels was examined. Table 5 shows the results.

TABLE 5

|  | Sample No. | | | |
| --- | --- | --- | --- | --- |
|  | 41 | 42 | 43 | 44 |
| Type Ib Nitrogen Concentration (ppm) | 130 | 165 | 168 | 165 |
| Percentage of (111) Plane Growth Sector (%) | 95 | 98 | 100 | 100 |
| Dopant | — | Ni | Ni + B | Ni + B |
| Amount of Peak Absorption at 1332 cm$^{-1}$ (cm$^{-1}$) | 0 | 0.82 | 1.24 | 4.33 |
| Absorption Coefficient of H3 Center (cm$^{-1}$) (at 470 nm) | 1.1 | 5.8 | 6.9 | 7.3 |
| Absorption Coefficient of NV Center (cm$^{-1}$) (at 570 nm) | 11.2 | 1.9 | 0.9 | 0.2 |
| Laser Output Energy (μJ) | 0 | 22 | 38 | 51 |
|  | Comparative Sample | Example | Example | Example |

Then, the relationship between the percentages of the (100) plane growth sectors and laser output energy levels was examined. The diamond crystals were doped with nickel and boron. Table 6 shows the results.

TABLE 6

|  | Sample No. | | |
| --- | --- | --- | --- |
|  | 51 | 52 | 53 |
| Type Ib Nitrogen Concentration (ppm) | 142 | 153 | 165 |
| Percentage of (111) Plane Growth Sector (%) | 30 | 60 | 100 |
| Dopant | Ni + B | Ni + B | Ni + B |
| Amount of Peak Absorption at 1332 cm$^{-1}$ (cm$^{-1}$) | 0.91 | 2.50 | 4.33 |
| Absorption Coefficient of H3 Center (cm$^{-1}$) (at 470 nm) | 2.8 | 4.5 | 7.3 |
| Absorption Coefficient of NV Center (cm$^{-1}$) (at 570 nm) | 8.1 | 3.9 | 0.2 |
| Laser Output Energy (μJ) | 0 | 13 | 51 |
|  | Comparative Sample | Example | Example |

Further, the relationship between type Ib nitrogen concentration and the laser output energy level was examined. The diamond crystals were doped with nickel and boron. Tabel 7 shows the results.

TABLE 7

|  | Sample No. | | | |
| --- | --- | --- | --- | --- |
|  | 61 | 62 | 63 | 64 |
| Type Ib Nitrogen Concentration (ppm) | 21 | 30 | 165 | 320 |
| Percentage of (111) Plane Growth Sector (%) | 100 | 100 | 100 | 100 |

TABLE 7-continued

| | Sample No. | | | |
|---|---|---|---|---|
| | 61 | 62 | 63 | 64 |
| Dopant | Ni | Ni | Ni + B | Ni |
| Amount of Peak Absorption at 1332 cm$^{-1}$ (cm$^{-1}$) | 0.5 | 0.94 | 4.33 | 3.7 |
| Absorption Coefficient of H3 Center (cm$^{-1}$) (at 470 nm) | 0 | 0.5 | 7.3 | 5.5 |
| Absorption Coefficient of NV Center (cm$^{-1}$) (at 570 nm) | 0.3 | 0.1 | 0.2 | 0.1 |
| Laser Output Energy (μJ) | 0 | 11 | 51 | 43 |
| | Comparative Sample | Example | Example | Example |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a diamond laser crystal comprising the steps of preparing a synthetic type Ib diamond having a (111) plane growth sector taking up at least 60% of the diamond's volume; thermally treating said synthetic diamond under high temperature and high pressure sufficient for converting type Ib nitrogen contained in said synthetic diamond to type IaA nitrogen; irradiating said synthetic diamond with an electron or neutron beam thereby to generate vacancies in said synthetic diamond; and annealing said synthetic diamond to form H3 centers by coupling said type IaA nitrogen and said vacancies in said synthetic diamond, said annealing being performed under a pressure not more than 10$^{-1}$ Torr at a temperature within the range of 1300° to 1600° C. for five hours.

2. The method of claim 1, further comprising doping said synthetic type Ib diamond with one of boron and nickel.

3. The method of claim 1, wherein said type Ib nitrogen is present in said synthetic type Ib diamond in a concentration within a range of 30 to 600 p.p.m.

4. The method of claim 1, wherein said type Ib synthetic diamond has an infrared absorption peak at a wavenumber of 1332 cm$^{-1}$, and an absorption coefficient within a range of 0.8 to 15 cm$^{-1}$.

5. The method of claim 1, wherein said thermal treating step for converting said type Ib nitrogen to said type IaA nitrogen is performed at a pressure within the range of 3 to 7 GPa and at a temperature within the range of 1500° to 2500° C. for at least five hours.

6. The method of claim 5, wherein said thermal treating step is performed after irradiating said synthetic diamond with said electron or neutron beam.

7. The method of claim 1, wherein said electron beam to be applied to said synthetic diamond has an energy of 0.5 to 4 MeV, and wherein an applied dose is within the range of 10$^{17}$ to 10$^{19}$ e/cm$^2$.

8. The method of claim 1, wherein said neutron beam to be applied to said synthetic diamond has an energy of 0.5 to 4 MeV, and wherein an applied dose is within the range of 10$^{15}$ to 10$^{17}$ n/cm$^2$.

9. A method for manufacturing a diamond laser crystal comprising the steps of preparing a synthetic type Ib diamond having a (111) plane growth sector taking up at least 60% of the diamond's volume; thermally treating said synthetic diamond under a pressure within the range of 3 to 7 GPa at a temperature within the range of 1800° to 2500° C. for at least five hours; irradiating said synthetic diamond with an electron beam having an energy within the range of 0.5 to 4 MeV at a dose within the range of 10$^{17}$ to 10$^{19}$ e/cm$^2$; and annealing said synthetic diamond under a pressure of not more than 10$^{-1}$ Torr at a temperature within the range of 1300° to 1600° C. for at least five hours.

10. The method of claim 9, further comprising holding said synthetic diamond under said pressure of not more than 10$^{-1}$ Torr at a temperature within the range of 600° to 1200° C. for at least five hours prior to said annealing step.

11. A method for manufacturing a diamond laser crystal comprising the steps of doping with one of boron and nickel a synthetic type Ib diamond having a (111) plane growth sector taking up at least 60% of the diamond's volume; irradiating said synthetic diamond with an electron or neutron beam; thermally treating said synthetic diamond under a pressure within the range of 3 to 7 GPa at a temperature within the range of 1500° to 2500° C. for at least five hours after said step of irradiating said synthetic diamond with said electron or neutron beam; again irradiating said synthetic diamond with an electron or neutron beam after said thermal treating step; and holding said synthetic diamond under a vacuum atmosphere at a temperature within the range of 1300° to 1600° C. for at least five hours.

12. The method of claim 11, wherein said type Ib nitrogen is present in said diamond in a concentration within a range of 30 to 600 p.p.m.

13. The method of claim 11, wherein said synthetic type Ib diamond has an infrared absorption peak at a wavenumber of 1332 cm$^{-1}$, and an absorption coefficient within a range of 0.8 to 15 cm$^{-1}$.

14. The method of claim 11, wherein said electron beam to be applied to said synthetic diamond has an energy of 0.5 to 4 MeV, and wherein an applied dose is within the range of 10$^{17}$ to 10$^{19}$ e/cm$^2$.

15. The method of claim 11, wherein said neutron beam to be applied to said synthetic diamond has an energy of 0.5 to 4 MeV, and wherein an applied dose is within the range of 10$^{15}$ to 10$^{17}$ n/cm$^2$.

16. A diamond laser crystal prepared from a synthetic type Ib diamond doped with one of boron and nickel, and a (111) plane growth sector taking up at least 60% of the diamond's volume.

17. The diamond laser crystal of claim 16, wherein said diamond laser crystal has an infrared absorption peak at a wavenumber of 1332 cm$^{-1}$, and an absorption coefficient within a range of 0.8 to 15 cm$^{-1}$.

18. A method for manufacturing a diamond laser crystal comprising the following steps: preparing a synthetic type Ib diamond having a (111) plane growth sector taking up at least 60% of the diamond's volume; thermally treating said synthetic diamond under high temperature and high pressure sufficient for converting type Ib nitrogen contained in said synthetic diamond to type IaA nitrogen; irradiating said synthetic diamond with an electron or neutron beam thereby to generate vacancies in said synthetic diamond; first annealing said synthetic diamond under a pressure of not more than $10^{-1}$ Torr at a temperature within the range of 600° to 1200° C. for at least five hours, and further annealing said synthetic diamond under said pressure of not more than $10^{-1}$ Torr at an increased temperature within the range of 1300° to 1600° C. for at least five hours after said first annealing step.

19. The method of claim 18, further comprising doping said synthetic type Ib diamond with one of boron and nickel.

20. The method of claim 18, wherein said type Ib nitrogen is present in said synthetic type Ib diamond in a concentration within a range of 30 to 600 p.p.m.

21. The method of claim 18, wherein said type Ib synthetic diamond has an infrared absorption peak at a wavenumber of 1332 cm$^{-1}$, and an absorption coefficient within a range of 0.8 to 15 cm$^{-1}$.

22. The method of claim 18, wherein said thermal treating step for converting said type Ib nitrogen to said type IaA nitrogen is performed at a pressure within the range of 3 to 7 GPa at a temperature within the range of 1500° to 2500° C. for at least five hours.

23. The method of claim 22, wherein said thermal treating step is performed after irradiating said synthetic diamond with said electron or neutron beam.

24. The method of claim 18, wherein said electron beam to be applied to said synthetic diamond has an energy of 0.5 to 4 MeV, and wherein an applied dose is within the range of $10^{17}$ to $10^{19}$ e/cm$^2$.

25. The method of claim 18, wherein said neutron beam to be applied to said synthetic diamond has an energy of 0.5 to 4 MeV, and wherein an applied dose is within the range of $10^{15}$ to $10^{17}$ n/cm$^2$.

* * * * *

UNITED STATES PATENT AND TRADEMARK OFFICE
CERTIFICATE OF CORRECTION

PATENT NO. : 4,950,625

DATED : August 21, 1990

INVENTOR(S) : Takeru Nakashima; Shuichi Satoh; Kazuwo Tsuji

It is certified that error appears in the above-identified patent and that said Letters Patent is hereby corrected as shown below:

In [54] line 1, after "METHOD" insert --FOR--.

In [57] ABSTRACT, line 2, after "efficiency" insert --,--;
line 3, after "first" delete ",";
line 5, delete "is prepared".

On sheet 1 of the drawings, please lable the top figure as "FIG. 1".

Column 1, line 1, after "METHOD" insert --FOR--.

Claim 1, (Col. 15, line 35), after "at" insert --least--.

Signed and Sealed this

Third Day of September, 1991

Attest:

HARRY F. MANBECK, JR.

Attesting Officer

Commissioner of Patents and Trademarks